United States Patent
Yeh et al.

(10) Patent No.: US 8,703,594 B2
(45) Date of Patent: Apr. 22, 2014

(54) SEMICONDUCTOR DEVICE HAVING A TREATED GATE STRUCTURE AND FABRICATION METHOD THEREOF

(75) Inventors: Ming-Hsi Yeh, Hsinchu (TW);
Tsung-Chieh Tsai, Chu-Bei (TW);
Chun-Yi Lee, Beipu Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 38 days.

(21) Appl. No.: 13/280,770

(22) Filed: Oct. 25, 2011

(65) Prior Publication Data

US 2013/0102138 A1    Apr. 25, 2013

(51) Int. Cl.
*H01L 21/28*    (2006.01)

(52) U.S. Cl.
USPC ........... 438/585; 257/338; 257/357; 257/407; 257/E21.19; 438/199; 438/157; 438/283; 438/230

(58) Field of Classification Search
USPC .......... 257/338, 357, 407; 438/585, 199, 157, 438/283, 230
See application file for complete search history.

(56) References Cited

U.S. PATENT DOCUMENTS

| | | | | |
|---|---|---|---|---|
| 6,373,109 | B1 * | 4/2002 | Ahn | 257/384 |
| 6,835,989 | B2 * | 12/2004 | Lin et al. | 257/407 |
| 7,064,038 | B2 * | 6/2006 | Kudo et al. | 438/296 |
| 7,816,213 | B2 * | 10/2010 | Matsuki | 438/283 |
| 2007/0221970 | A1 * | 9/2007 | Kadoshima et al. | 257/288 |
| 2010/0140708 | A1 * | 6/2010 | Hill et al. | 257/348 |

* cited by examiner

*Primary Examiner* — Lex Malsawma
*Assistant Examiner* — Sheng Zhu
(74) *Attorney, Agent, or Firm* — Lowe Hauptman & Ham, LLP

(57) ABSTRACT

A method for fabricating a semiconductor device is disclosed. A dummy gate feature is formed between two active gate features in an inter-layer dielectric (ILD) over a substrate. An isolation structure is in the substrate and the dummy gate feature is over the isolation structure. Source/drain (S/D) features are formed at edges of the active gate features in the substrate for forming transistor devices. The disclosed method provides an improved method for reducing parasitic capacitance among the transistor devices. In an embodiment, the improved formation method is achieved by introducing species into the dummy gate feature to increase the resistance of the dummy gate feature.

20 Claims, 10 Drawing Sheets

SEMICONDUCTOR DEVICE HAVING A TREATED GATE STRUCTURE AND FABRICATION METHOD THEREOF

FIELD

The disclosure relates to integrated circuit fabrication, and more particularly to a semiconductor device with a strained structure.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. The MOSFET processes comprise a "gate last" process to replace an original polysilicon gate electrode with the metal gate electrode to improve device performance.

However, there are challenges to implement such features and processes in complementary metal-oxide-semiconductor (CMOS) fabrication. As the gate length and spacing between devices decrease, these problems are exacerbated. For example, it is difficult to prevent parasitic capacitance among gate stacks of the MOSFET because of the reduced spacing between the gate stacks, thereby affecting the device performance.

Accordingly, what is needed is an improved method for fabricating the gate stacks in a semiconductor device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
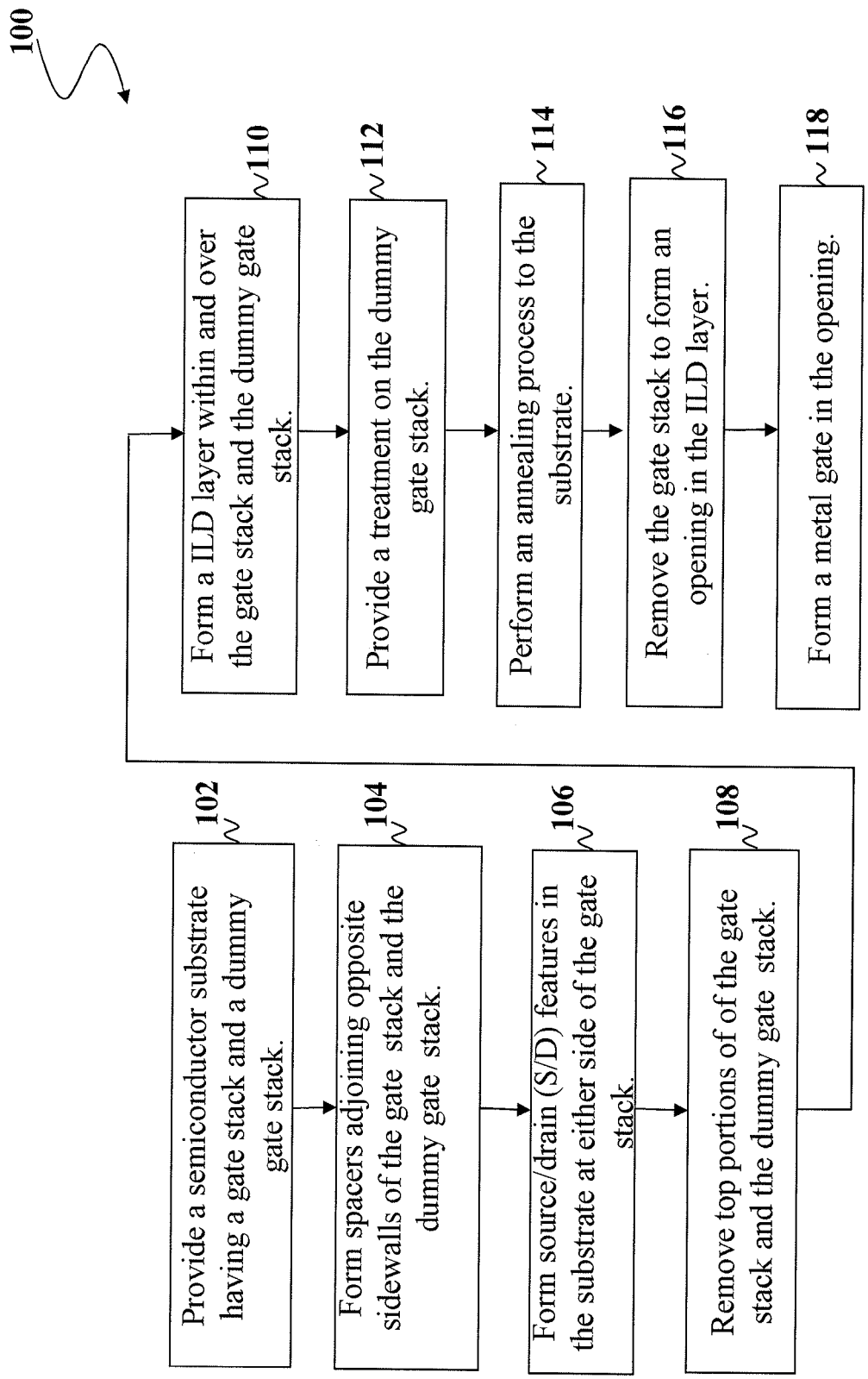
FIG. 1 is a flowchart illustrating a method for fabricating a semiconductor device comprising gate stacks according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device according to various aspects of the present disclosure. FIGS. 2-10 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
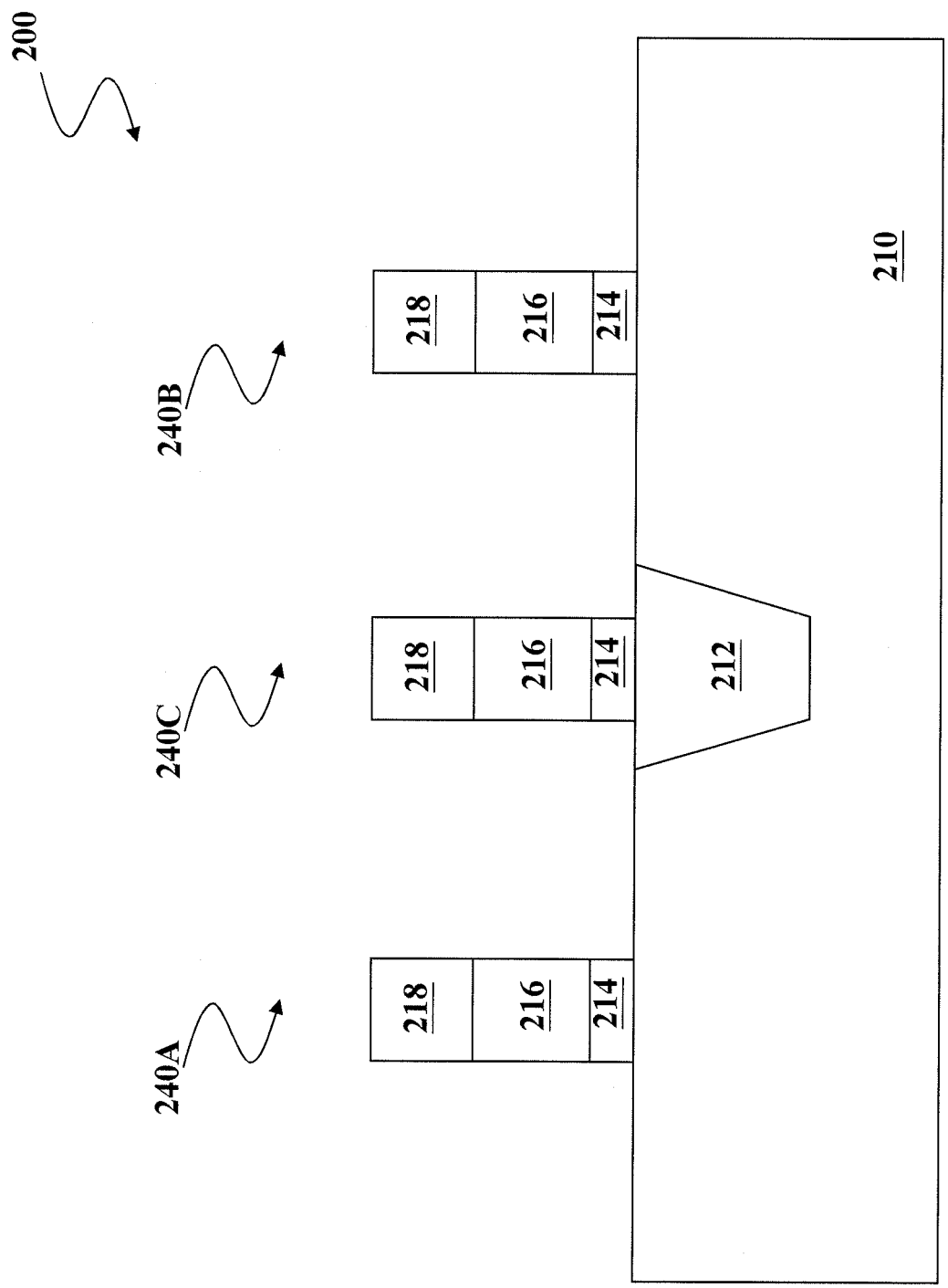
FIGS. 2-10 show schematic cross-sectional views of the gate stacks of a semiconductor device at various stages of fabrication according to various aspects of the present disclosure.

Referring to FIGS. 1 and 2, the method 100 begins at step 102 wherein a substrate 210 is provided. In one embodiment, the substrate 210 comprises a crystalline silicon substrate (e.g., wafer). In an alternative embodiment, the substrate 210 may include a silicon-on-insulator (SOI) structure. The substrate 210 may further comprise active regions (not shown). The active regions may include various doping configurations depending on design requirements as known in the art. In some embodiments, the active regions may be doped with p-type or n-type dopants. For example, the active regions may be doped with p-type dopants, using a chemical such as boron or $BF_2$ to perform the doping; n-type dopants, using a chemical such as phosphorus or arsenic to perform the doping; and/or combinations thereof. The active regions may act as regions configured for an N-type metal-oxide-semiconductor transistor device (referred to as an NMOS) and regions configured for a P-type metal-oxide-semiconductor transistor device (referred to as a PMOS).

In some embodiments, an isolation structure 212 is formed in the substrate 210 to isolate the various active regions. The isolation structure 212, for example, is formed using isolation technology, such as local oxidation of silicon (LOCOS) or shallow trench isolation (STI), to define and electrically isolate the various active regions. In the present embodiment, the isolation structure 212 includes an STI. The isolation structure 212 may comprise silicon oxide, silicon nitride, silicon oxynitride, fluoride-doped silicate glass (FSG), a low-K dielectric material, other suitable materials known in the art, and/or combinations thereof. The isolation structure 212 may be formed by any suitable process. As one example, the formation of an STI may include patterning the semiconductor substrate 210 by a photolithography process, etching a trench in the substrate 210 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in at least one embodiment, gate stacks 240A, 240B, and 240C are formed over the surface of the substrate 210. In the present embodiment, the gate stacks 240A, 240B are designed for forming active devices, and the gate stack 240C is a dummy gate stack. In the present embodiment, the dummy gate stack 240C is over the isolation structure 212 and between gate stacks 240A and 240B. In some embodiments, each of the gate stacks 240A, 240B, and the dummy gate stack 240C comprises, in order, a gate dielectric feature 214, a gate electrode feature 216, and a hard mask feature 218 over the substrate 210. In some embodiments, a gate dielectric layer (not shown), a gate electrode layer (not shown), and a hard mask layer (not shown) are sequentially deposited over the substrate 210. Then, a patterned photo-sensitive layer (not shown) is formed over the hard mask layer. The pattern of the photo-sensitive layer is transferred to the hard mask layer and then transferred to the gate electrode layer and gate dielectric layer to form the gate stacks 240A, 240B, and the dummy gate stack 240C. The photo-sensitive layer is stripped thereafter by a dry and/or wet stripping process.

The gate dielectric feature 214, in one example, is a thin film comprising silicon oxide, silicon nitride, silicon oxy-nitride, high-k dielectrics, other suitable dielectric materials known in the art, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric feature 214 comprises a high-k dielectric layer with a thickness in the range of about 10 angstroms to about 30 angstroms. The gate dielectric feature 214 may be formed using a suitable process such as atomic layer deposition (ALD), chemical vapor deposition (CVD), physical vapor deposition (PVD), thermal oxidation, UV-ozone oxidation, or combinations thereof. An interfacial layer (not shown) may further be included under the gate dielectric feature 214 to reduce the likely damage between the gate dielectric feature 214 and the substrate 210. The interfacial layer may comprise silicon oxide.

In some embodiments, the gate electrode feature 216 over the gate dielectric feature 214 comprises a single layer or multilayer structure. In the present embodiment, the gate electrode feature 216 may comprise poly-silicon. Further, the gate electrode feature 216 may be doped poly-silicon with doping species. In one embodiment, the gate electrode feature 216 has a thickness in the range of about 30 nm to about 60 nm. The gate electrode feature 216 may be formed using a process such as low-pressure chemical vapor deposition (LPCVD); plasma enhanced chemical vapor deposition (PECVD), other suitable processes, or combinations thereof. In one embodiment, silane ($SiH_4$) is used as a chemical gas in the CVD process to form the gate electrode feature 216. In other embodiments, the gate electrode feature 216 and/or the gate dielectric feature 214 may be sacrificial layers and will be removed by a replacement step in the subsequent processes.

In some embodiments, the hard mask feature 218 over the gate electrode feature 216 comprises silicon oxide. Alternatively, the hard mask feature 218 may comprise silicon nitride, silicon oxynitride, and/or other suitable dielectric materials, and may be formed using a method such as CVD or PVD. In some embodiments, the hard mask feature 218 has a thickness in the range from about 100 angstroms to about 800 angstroms.

Figure 3:
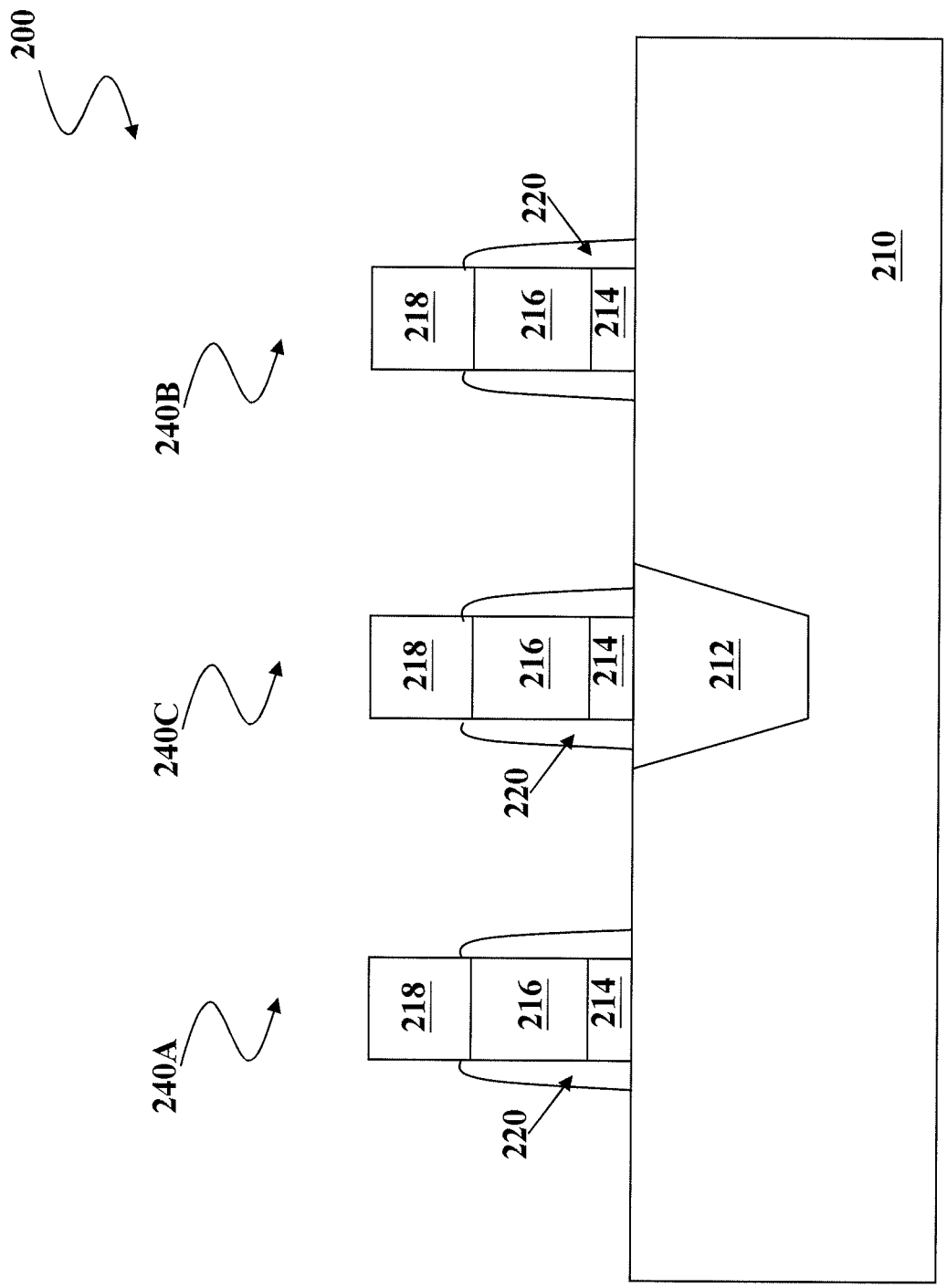

Referring to FIGS. 1 and 3, the method 100 proceeds to step 104 wherein gate spacers 220 are formed adjoining opposite sidewalls of the gate stacks 240A, 240B, and the dummy gate stack 240C. In some embodiments, the gate spacers 220 may include a single-layer or a multiple-layer structure. In the present embodiment, a blanket layer of spacer material (not shown) is formed within and over the gate stacks 240A, 240B, and the dummy gate stack 240C by a depositing process including CVD, PVD, ALD, or other suitable techniques. In some embodiments, the spacer material comprises silicon oxide, silicon nitride, silicon oxy-nitride, other suitable material, or combinations thereof. In some embodiments, the spacer material has a thickness ranging from about 5 nm to about 15 nm. Then, an anisotropic etching process is performed on the spacer material to form the gate spacers 220. In some embodiments, the gate spacers 220 have a height less than the height of the gate stacks 240A, 240B, and the dummy gate stack 240C. In an embodiment, the gate spacers 220 are adjoining sidewalls of the gate dielectric feature 214 and the gate electrode feature 216, but expose sidewalls of the hard mask feature 218.

Figure 4:
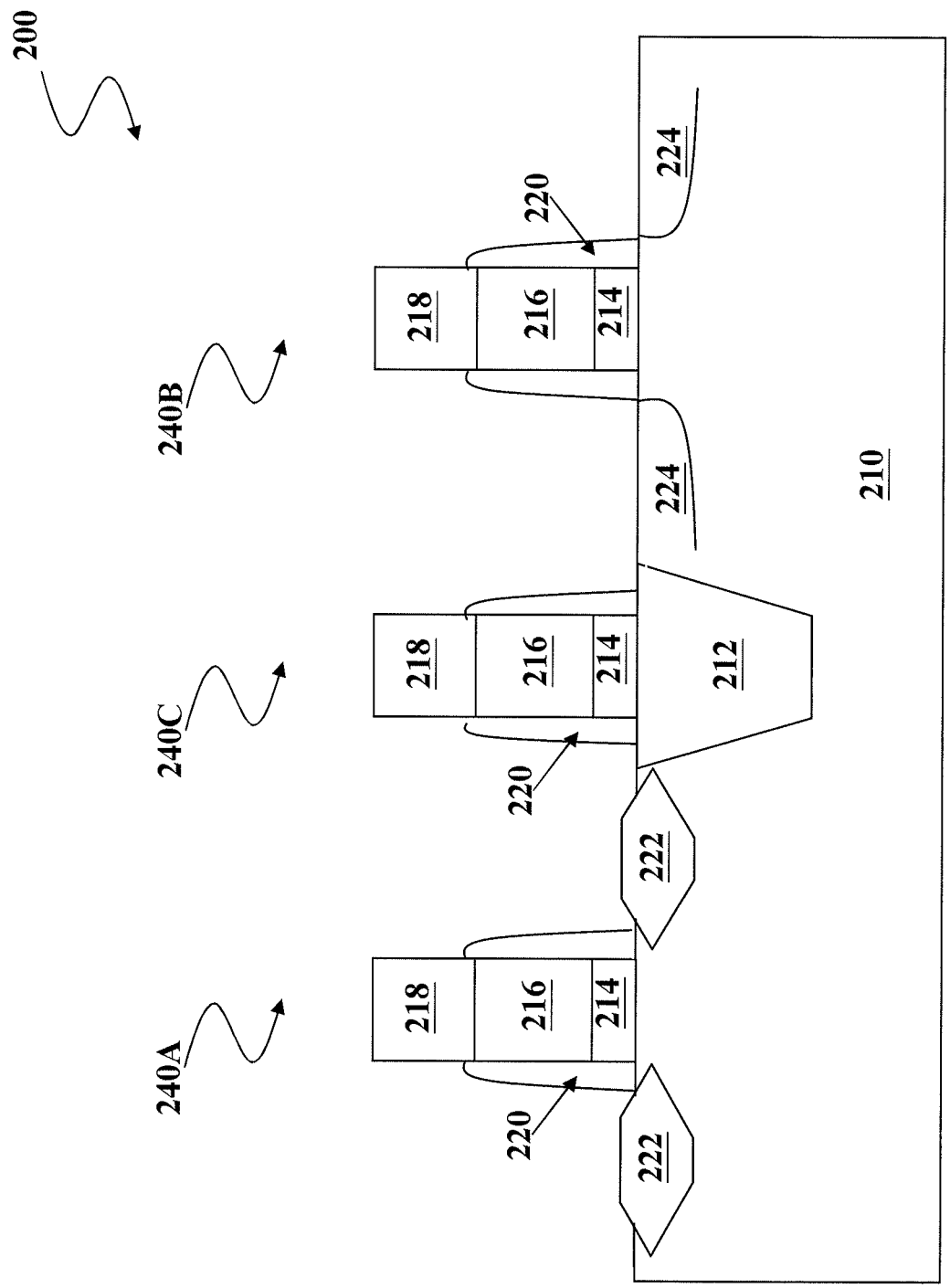

Referring to FIGS. 1 and 4, the method 100 continues with step 106 in which source/drain (S/D) features 222, 224 are formed in the substrate 210. In one embodiment, the source/drain (S/D) features 222 are configured to the gate stack 240A for PMOS device, and the source/drain (S/D) features 224 are configured to the gate stack 240B for NMOS device. The formation processes of the S/D features 222 may start from forming recess cavities (not shown) at either side of the gate stack 240A in the substrate 210. In the present embodiment, the recess cavities are formed using an isotropic dry etching process and then followed by an anisotropic wet or dry etching process. In embodiments, a strained material is grown to fill in the recess cavities to form the S/D features 222. In some embodiments, the growth process of the strained material comprises selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes known in the art, or combinations thereof. In some embodiments, the strained material is silicon germanium (SiGe). In some embodiments, the strained material is epi SiGe with p-type dopants, such as boron.

In an embodiment, the S/D features 224 are formed at either side of the gate stack 240B in the substrate 210 by one or more ion implantation processes. The implantation, for example, is performed using n-type dopants, such as phosphorus or arsenic, under designed implantation energy and tilt angle to meet the requirements of device performance. In an alternative embodiment, the S/D features 224 include epi silicon (Si) with n-type dopants. Processes for forming the epi Si may include some etching processes for forming recess cavities (not shown) in the substrate 210 and then filling the recess cavities with the epi Si. The growth process of the epi Si comprises SEG, CDE, CVD techniques, MBE, other suitable epi processes known in the art, or combinations thereof.

Figure 5:
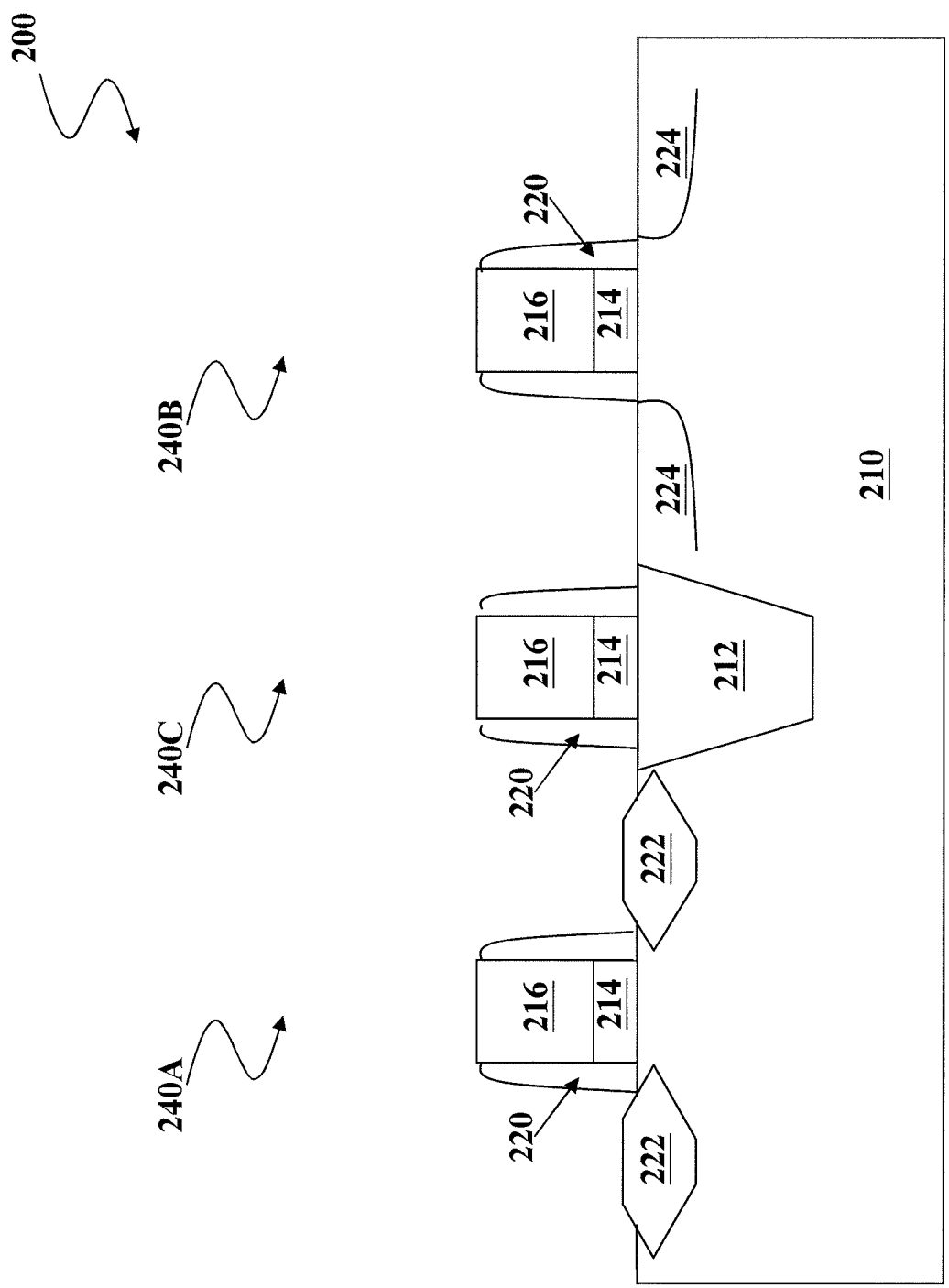

Referring to FIGS. 1 and 5, the method 100 continues with step 108 in which the hard mask feature 218 is removed from the gate stacks 240A, 240B, and the dummy gate stack 240C by an etching process. The etching process may include, for example, using a dry etching, wet etching, and/or plasma etching process. In some embodiments, the etching process is performed using $NF_3$ gas and/or argon gas, with flow rates ranging from about 10 sccm to about 100 sccm and from about 10 sccm to about 200 sccm, respectively. In some embodiments, the first step of the etching process is performed with a RF bias greater than about 60V, under a vacuum pressure ranging from about 10 mTorr to about 100 mTorr. In some embodiments the RF bias is between about 60V and about 200V. The step of removing the hard mask feature 218 may reduce the heights of the gate stacks 240A, 240B, and the dummy gate stack 240C; therefore, reducing the aspect ratio of the gaps between the gate stacks 240A, 240B, and the dummy gate stack 240C. The reduced aspect ratio is helpful for a subsequent gap filling process.

Figure 6:
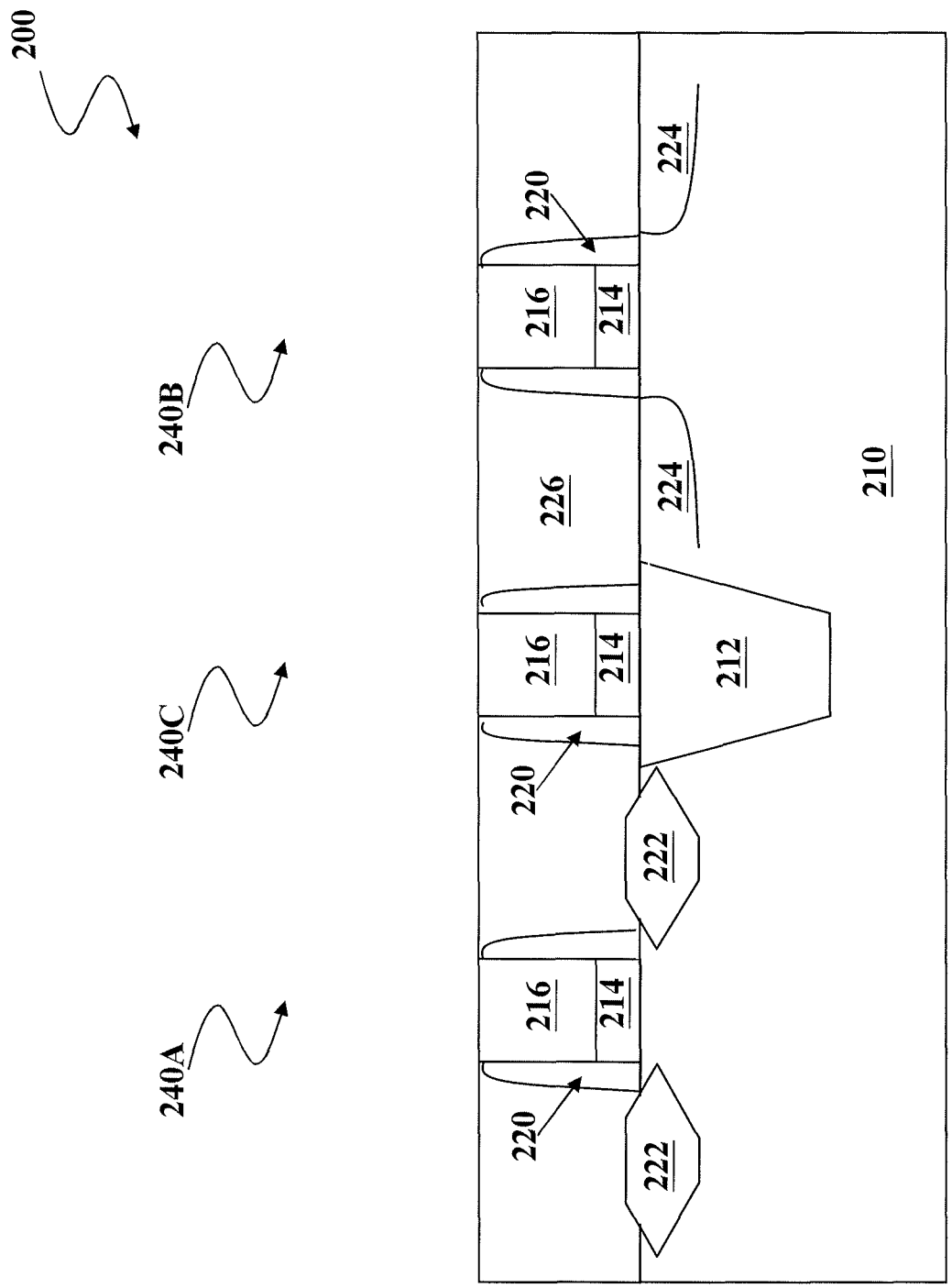

Referring to FIGS. 1 and 6, the method 100 continues with step 110 in which an interlayer dielectric (ILD) 226 is formed within the gate stacks 240A, 240B and the dummy gate stack 240C. The ILD 226 may include materials such as oxide, nitride, oxynitride, low-k dielectric material, ultra low-k dielectric material, extreme low-k dielectric material, other dielectric material, and/or combinations thereof. In some embodiments, the ILD 226 is formed by depositing an ILD layer (not shown) within and over the gate stacks 240A, 240B and the dummy gate stack 240C, then, applying a planarization process to remove the portion of ILD layer over the gate stacks 240A, 240B and the dummy gate stack 240C. In some embodiments, the step of depositing the ILD layer comprises a CVD process, a HDP CVD process, a HARP, a spin-coating process, other deposition process, and/or any combinations thereof. In some embodiments, the planarization process includes a chemical-mechanical polish (CMP) process, a dry etch process, a wet etch process, and/or combinations thereof. The planarization process may form the ILD 226 with a top surface substantially co-planer with the top surface of the gate stacks 240A, 240B and the dummy gate stack 240C.

Figure 7:
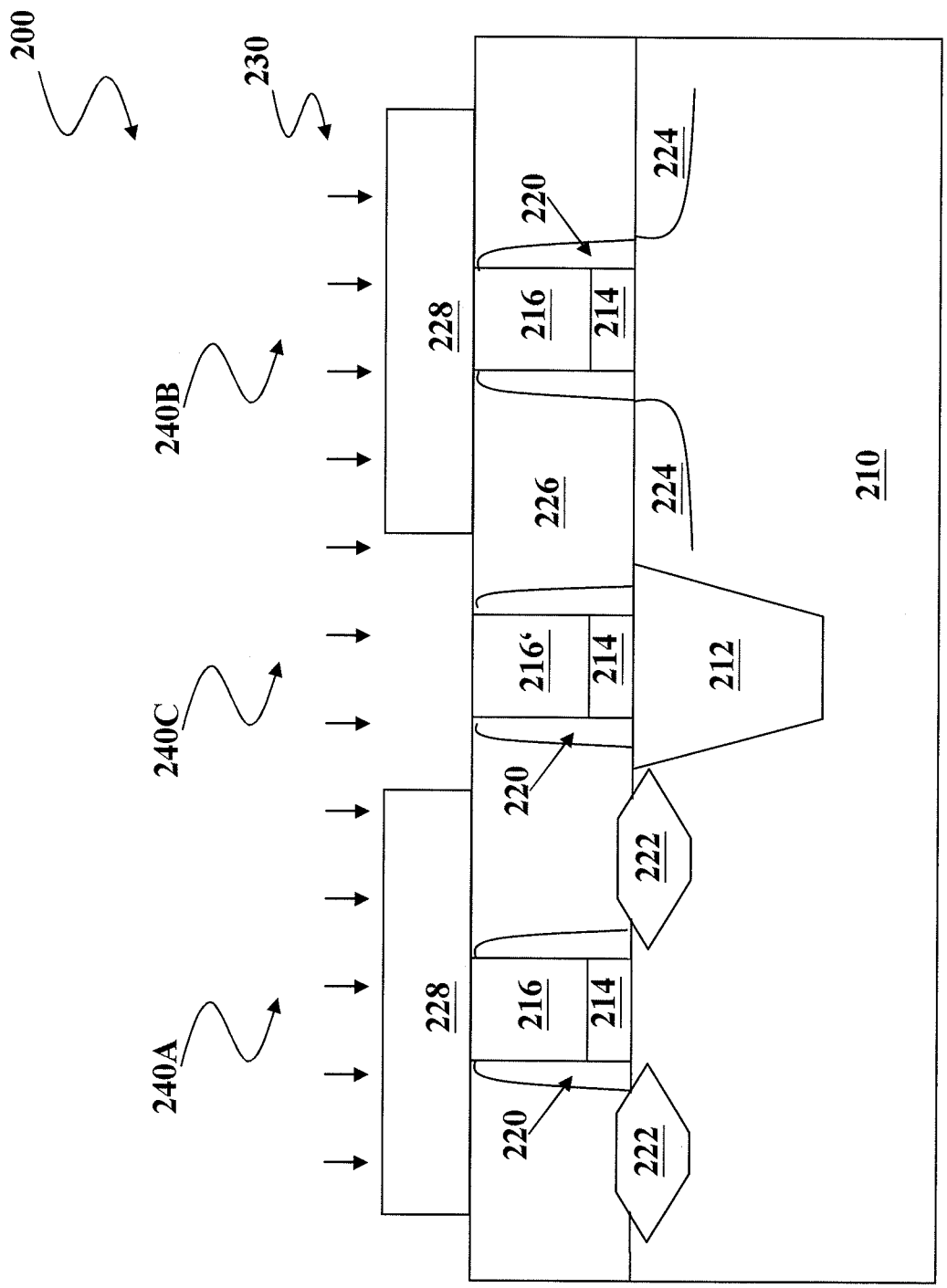

Referring to FIGS. 1 and 7, the method 100 continues with step 112 in which a treatment 230 is provided to a dummy gate stack 240C, thereafter, the gate electrode feature 216 is transformed to a treated gate electrode feature 216'. The energy source of the treatment 230 can be provided by an ion implantation process, or other suitable processes known in the art including thermal diffusion, plasma, e-beam, ultraviolet (UV), or combinations thereof. In embodiments, the treatment 230 introduces oxygen-containing species, comprising $O_2$, $O_3$, $CO_2$, or combinations thereof, into the gate electrode feature 216 to form the treated gate electrode feature 216'. In one embodiment, the oxygen-containing species is distributed within the entire treated gate electrode feature 216'. In an alternative embodiment, at least 50% volume of the treated gate electrode feature 216' contains the oxygen-containing species. In some embodiments, the treatment 230 is an ion implantation process performed at an energy ranging between about 2 KeV to about 20 KeV. In some embodiments, the treatment 230 is an ion implantation process performed with a dosage ranging between about 1E13 atoms/$cm^2$ and about 1E17 atoms/$cm^2$. The gate stacks 240A, 240B are not transformed by the treatment 230 because gate stacks 240A and 240B are covered by protectors 228, e.g., photoresist patterns. In some embodiments, the protectors 228 are removed by a stripping process after the treatment 230.

Figure 8:
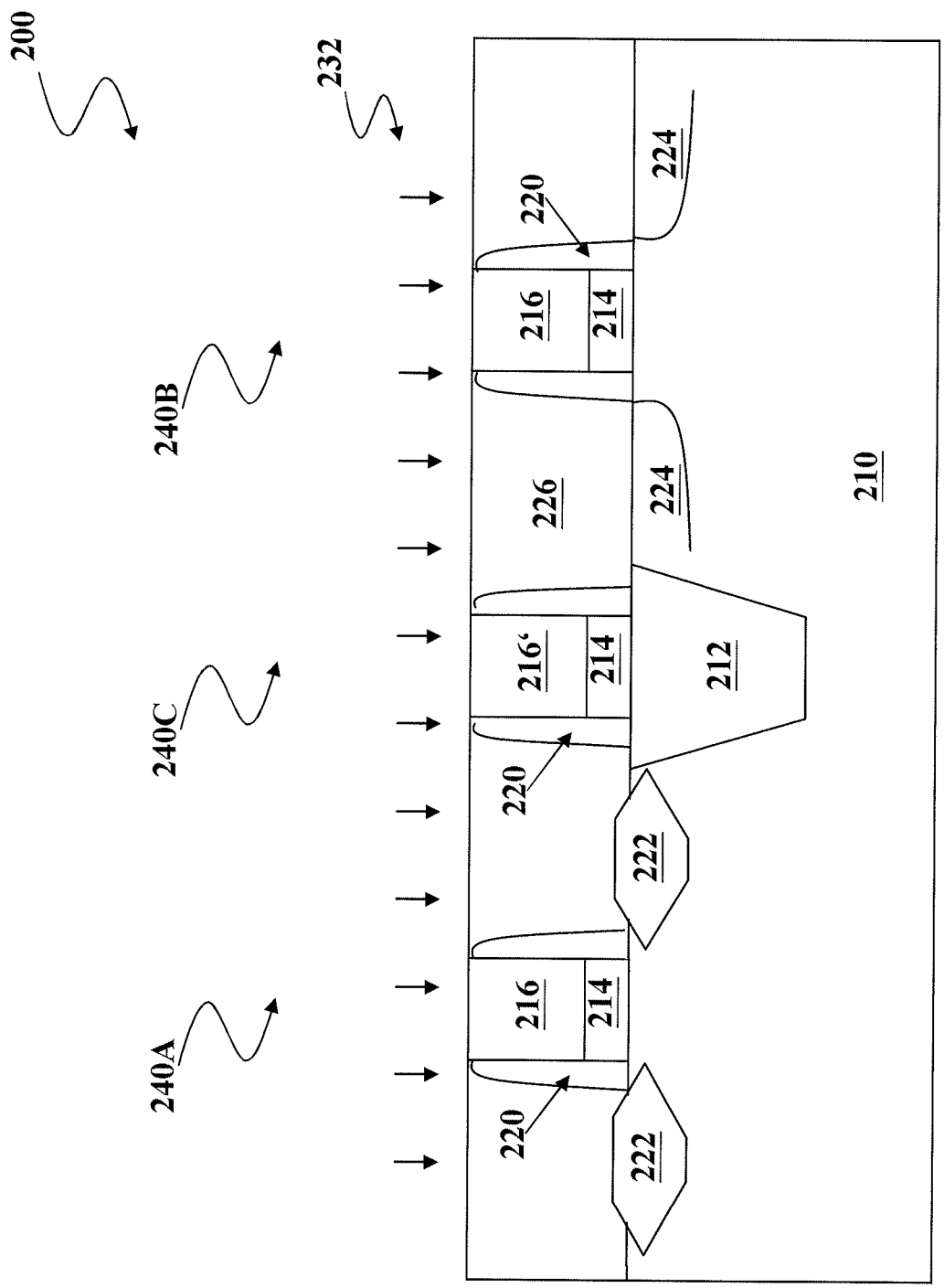

Referring to FIGS. 1 and 8, the method 100 continues with step 114 in which an annealing process 232 is provided to the substrate 210. In some embodiments, the annealing process 232 is provided for diffusion and/or activation of the species distributed in the treated gate electrode feature 216'. In one embodiment, the annealing process 232 is performed at a temperature ranging between about 700° C. and about 1000° C. for a period of time ranging between about 10 sec and about 30 min. In some embodiments, the annealing process 232 is provided by furnace process, RTA (rapid thermal annealing) process, flash anneal, or other suitable process known in the art. In some embodiments, the annealing process 232 oxidizes the treated gate electrode feature 216' by causing a chemical reaction between the oxygen-containing species and the poly-silicon in the treated gate electrode feature 216'. In one embodiment, the poly-silicon is entirely oxidized after the annealing process 232, therefore forming the treated gate electrode feature 216' being composed of silicon oxide. In an alternative embodiment, at least 50% volume of the poly-silicon is oxidized after the annealing process 232, therefore forming the treated gate electrode feature 216' being composed of at least 50% of the silicon oxide and poly-silicon. The treatment 230 and/or the annealing process 232 may form the treated gate electrode feature 216' with a higher resistance or lower conductance than the gate electrode feature 216.

Figure 9:
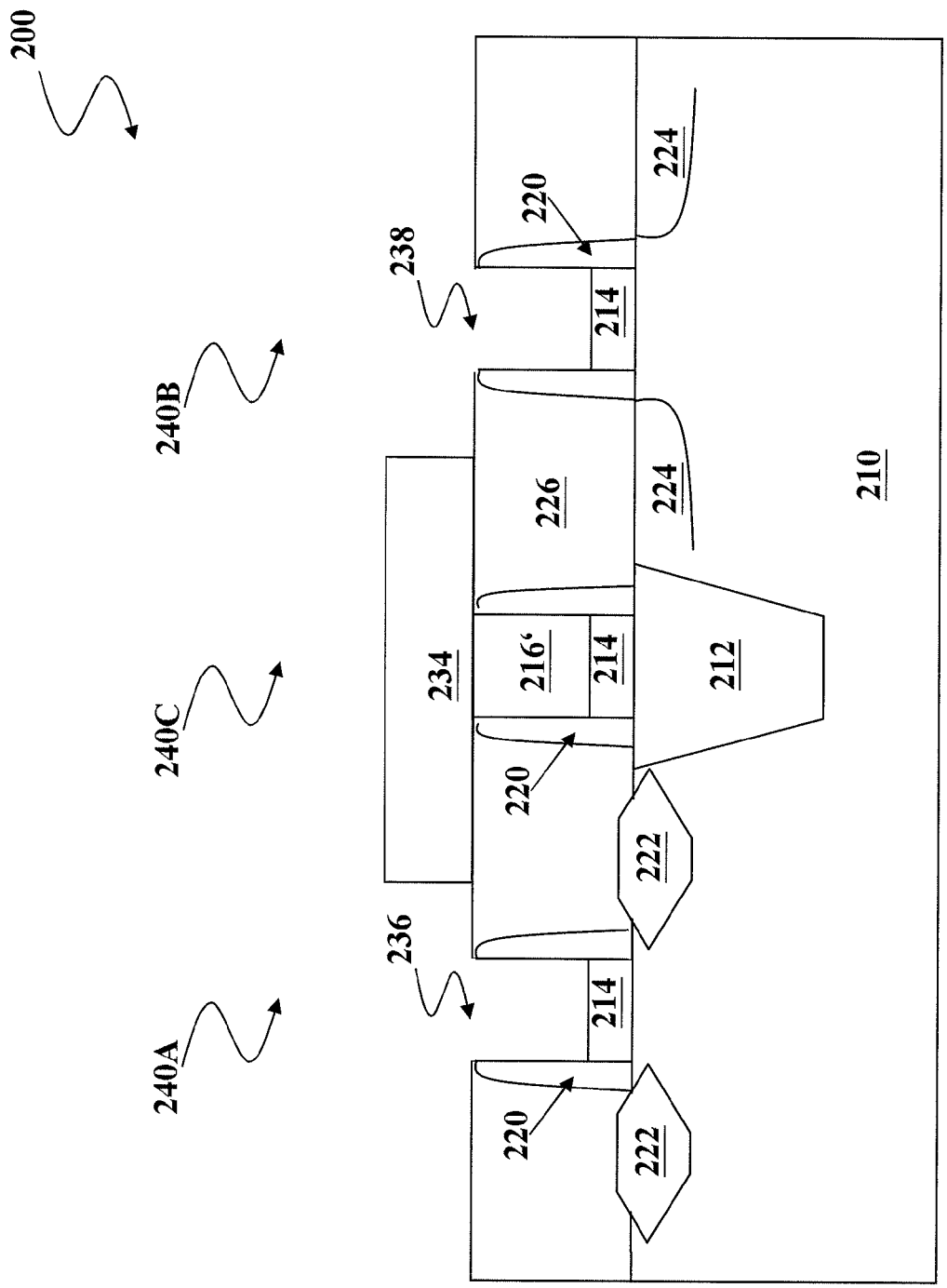

Referring to FIGS. 1 and 9, the method 100 continues with step 116 in which a removing process is provided to remove the gate stacks 240A, 240B to form openings 236, 238, respectively, in the ILD 226. The treated gate electrode feature 216' is not removed in the removing process by providing a protector 234, e.g., a photoresist pattern, thereon. In an embodiment, the removing process removes the gate electrode feature 216 in the gate stacks 240A, 240B but leaves the gate dielectric feature 214 of the gate stacks 240A, 240B if the gate dielectric features 214 comprising a high-k dielectric material. In an alternative embodiment, the removing process removes the gate electrode feature 216 and the gate dielectric feature 214 of the gate stacks 240A, 240B if the gate dielectric feature 214 is not composed of a high-k dielectric material. The removing process can include a dry etch process and/or a wet etch process. In some embodiments, the removing process is a two-step dry etching process comprising a first step to break through (remove) a native oxide (not shown) over the gate electrode feature 216 and a second step to remove the gate electrode feature 216 (e.g., poly-silicon). In some embodiments, the first step of the etching process is performed using $NF_3$ gas and/or argon gas, with flow rates ranging from about 10 sccm to about 100 sccm and from about 10 sccm to about 200 sccm, respectively. In some embodiments, the first step of the etching process is performed with a RF bias greater than about 60V, under a vacuum pressure ranging from about 10 mTorr to about 100 mTorr. In some embodiments the RF bias is between about 60V and about 200V. The second step of the etching process is performed, for example, using Cl gas, HBr gas, He gas, or combinations thereof. In the present embodiment, the flow rates of Cl gas, HBr gas, and He ranges from about 10 sccm to about 100 sccm, from about 200 sccm to about 400 sccm, and from about 100 sccm to about 300 sccm, respectively. In some embodiments, the second step of the etching process is performed with a RF bias less than the RF bias for performing the first step of the etching process. The RF bias for performing the second step of the etching process is, for example, ranging between about 60V and about 200V. In some embodiments, the second step of the etching process is performed under a vacuum pressure ranging from about 10 mTorr to about 100 mTorr. The protector 234 is thereafter removed by a stripping process.

Figure 10:
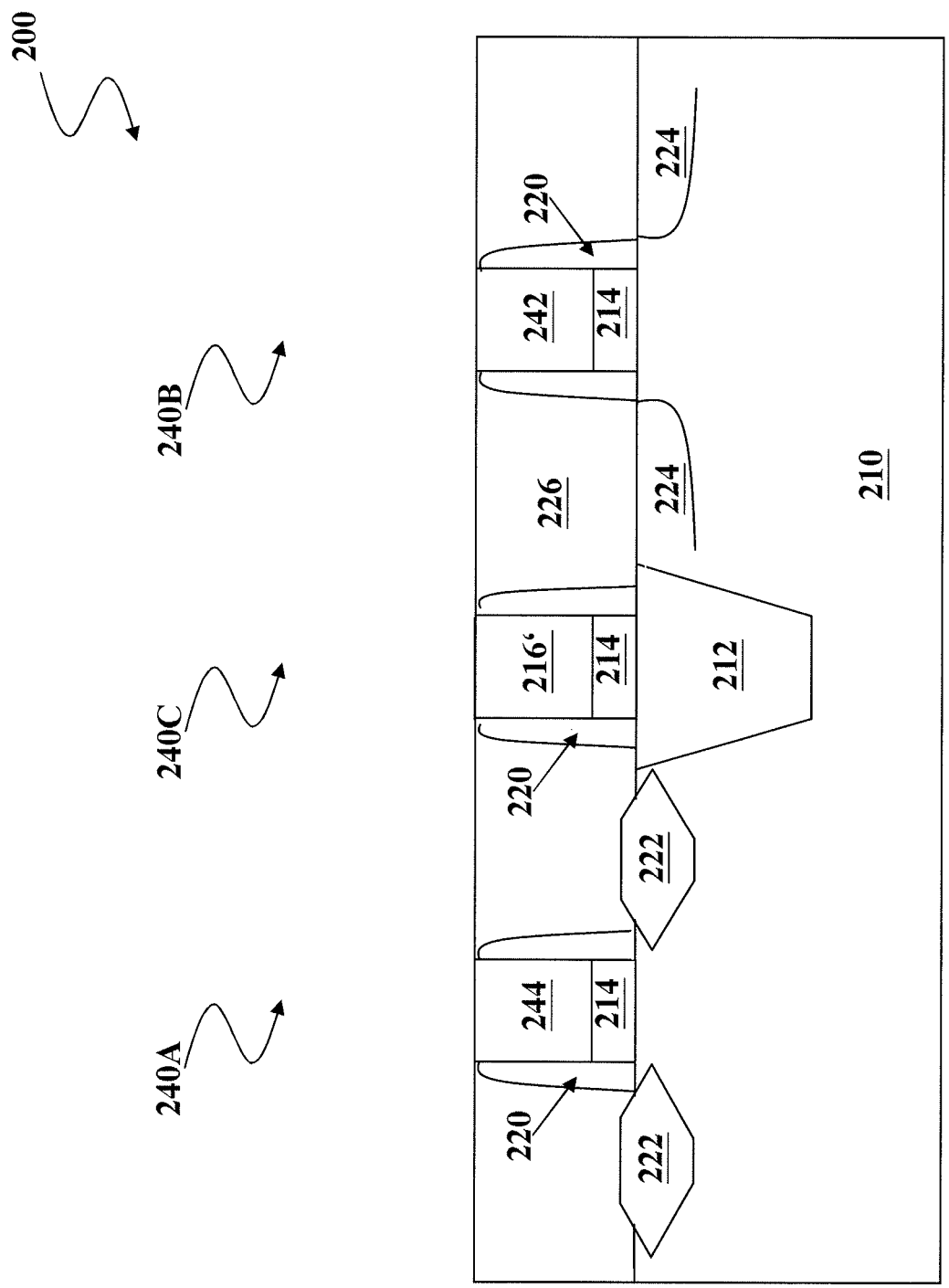

Referring to FIGS. 1 and 10, the method 100 continues with step 118 in which metal gates 244, 242 are formed in the openings 236, 238, respectively. The metal gates 244, 242 are formed to replace the gate electrode feature 216 (i.e., poly-silicon gate layer) of the gate stacks 240A, 240B. As mentioned above, the gate stack 240A is designed for PMOS device and the gate stack 240B is designed for NMOS device. The metal gate 244 has a first work function for PMOS device and the metal gate 242 has a second work function for NMOS device. In some embodiments, the metal gates 244, 242 comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials known in the art, and/or combinations thereof.

Subsequent processing may form various contacts/vias/ lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The various embodiments of the present disclosure discussed above offer advantage over conventional methods, it being understood that no particular advantage is required for all embodiments, and that different embodiments may offer different advantages. One of the advantages is that the spacing between adjacent conductive gates is increased, therefore reducing the parasitic capacitance among the transistor devices. Hence, the device operation speed may be enhanced to upgrade the device performance. Another advantage is that the likelihood of breakdown of the ILD and/or device failure may be reduced.

In one embodiment, a method for fabricating a semiconductor device, comprises forming a first gate feature and a second gate feature in an inter-layer dielectric (ILD) layer over a substrate, wherein the first and the second gate features have a first resistance; transforming the first gate feature to a treated gate feature with a second resistance, wherein the second resistance is higher than the first resistance; removing the second gate feature to form a opening in the ILD layer; and forming a conductive gate feature in the opening.

In another embodiment, a method for fabricating a semiconductor device, comprises forming a first poly-silicon gate electrode, a second poly-silicon gate electrode, and a third poly-silicon gate electrode over a substrate, wherein the first poly-silicon gate electrode is positioned between the second and the third poly-silicon gate electrodes; forming an inter-layer dielectric (ILD) within and over the first, the second, and the third poly-silicon gate electrodes; planarizing the ILD to form a planarized ILD with a surface substantially co-planar with the top surface of the first, the second, and the third poly-silicon gate electrodes; introducing a species into the first poly-silicon gate electrode; removing the second and the third poly-silicon gate electrodes to form a first and a second openings in the ILD; forming a first metal gate electrode in the first opening for a PMOS device; and forming a second metal gate electrode in the second opening for an NMOS device.

In still another embodiment, a method for fabricating a semiconductor device, comprises forming a sacrificial gate electrode and a dummy gate electrode over a substrate; forming an inter-layer dielectric (ILD) within the sacrificial gate electrode and the dummy gate electrode; transforming the dummy gate electrode into a treated dummy gate electrode with a resistance higher than the resistance of the sacrificial gate electrode or the dummy gate electrode; removing the sacrificial gate electrode to form a opening in the ILD; and forming a metal gate electrode in the opening for an active device.

While the disclosure has described by way of example and in terms of preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   forming a first gate feature and a second gate feature in an inter-layer dielectric (ILD) layer over a substrate, wherein the first gate feature comprises a first gate material, and the first and the second gate features have a first resistance;
   treating the first gate material to transform the first gate feature to a treated gate feature having a second resistance, wherein the second resistance is higher than the first resistance, and the treated gate feature comprises at least 50% by volume silicon oxide;
   removing the second gate feature to form an opening in the ILD layer; and
   forming a conductive gate feature in the opening.

2. The method of claim 1, wherein the step of transforming comprises:
   performing a treatment on the first gate feature; and
   thereafter annealing the substrate.

3. The method of claim 2, wherein the annealing is performed at a temperature ranging between about 700°C. and about 1000°C. for a period of time ranging between about 10 sec and about 30 min.

4. The method of claim 2, wherein the treatment introduces oxygen-containing species in the first gate feature.

5. The method of claim 2, wherein the treatment is performed using an ion implantation process.

6. The method of claim 5, wherein the ion implantation process is performed at an energy ranging between about 2 KeV to about 20 KeV with a dosage ranging between about 1E13 atoms/$cm^2$ and about 1E17 atoms/$cm^2$.

7. The method of claim 1, wherein the conductive gate feature is metal gate.

8. The method of claim 1, wherein the first and the second gate features comprises a poly-silicon gate electrode over a high-k dielectric layer.

9. The method of claim 1, wherein the step of removing the second gate feature is a two-step dry etching process comprising a first step to remove a native oxide film over a poly-silicon film and a second step to remove the poly-silicon film.

10. The method of claim 1, wherein forming the first gate feature comprises forming the first gate feature directly on top of an isolation structure in the substrate.

11. A method for fabricating a semiconductor device, comprising:
   forming a first poly-silicon gate electrode, a second poly-silicon gate electrode, and a third poly-silicon gate electrode over a substrate, wherein the first poly-silicon gate electrode is positioned between the second and the third poly-silicon gate electrodes;
   forming an inter-layer dielectric (ILD) within and over the first, the second, and the third poly-silicon gate electrodes;
   planarizing the ILD to form a planarized ILD with a surface substantially co-planar with the top surface of the first, the second, and the third poly-silicon gate electrodes;
   introducing a species into the first poly-silicon gate electrode;
   removing an entirety of the second and an entirety of the third poly-silicon gate electrodes to form a first opening and a second opening in the ILD;
   forming a first metal gate electrode in the first opening for a p-type metal-oxide-semiconductor (PMOS) device; and forming a second metal gate electrode in the second opening for an n-type metal-oxide-semiconductor (NMOS) device.

12. The method of claim 11, further comprising:
performing an annealing process after introducing the species in the first poly-silicon gate electrode.

13. The method of claim 12, wherein the annealing process transforms at least a portion of the first poly-silicon gate electrode into silicon oxide.

14. The method of claim 11, wherein the species introduced into the first poly-silicon gate electrode comprises $O_2$, $O_3$, $CO_2$, or combinations thereof.

15. The method of claim 11, wherein the first poly-silicon gate electrode is not removed when removing the second and the third poly-silicon gate electrodes.

16. The method of claim 11, wherein introducing the species is performed using an ion implantation process.

17. The method of claim 16, wherein the ion implantation process is performed at an energy ranging between about 2 KeV to about 20 KeV with a dosage ranging between about 1E13 atoms/cm$^2$ and about 1E17 atoms/cm$^2$.

18. A method for fabricating a semiconductor device, comprising:
forming a sacrificial gate electrode and a dummy gate electrode over a substrate, wherein forming the dummy gate electrode comprises forming the dummy gate electrode on top of an isolation feature in the substrate;
forming an inter-layer dielectric (ILD) within the sacrificial gate electrode and the dummy gate electrode;
transforming the dummy gate electrode into a treated dummy gate electrode with a resistance higher than the resistance of the sacrificial gate electrode or the dummy gate electrode;
removing the sacrificial gate electrode to form an opening in the ILD; and
forming a metal gate electrode in the opening for an active device.

19. The method of claim 18, wherein the step of transforming the dummy gate electrode into the treated dummy gate electrode comprises:
performing a treatment on the dummy gate electrode; and thereafter annealing the substrate.

20. The method of claim 19, wherein the treatment introduces oxygen-containing species into the dummy gate electrode.

* * * * *